US008503952B2

(12) United States Patent
Capofreddi et al.

(10) Patent No.: US 8,503,952 B2
(45) Date of Patent: Aug. 6, 2013

(54) COMPENSATION OF AN ASYMMETRIC FREQUENCY RESPONSE OF A RADIO

(75) Inventors: Peter Capofreddi, Santa Clara, CA (US); Sriraman Dakshinamurthy, Santa Clara, CA (US); Derek Shaeffer, Santa Clara, CA (US)

(73) Assignee: Broadcom Corporation, Irvine, CA (US)

( * ) Notice: Subject to any disclaimer, the term of this patent is extended or adjusted under 35 U.S.C. 154(b) by 837 days.

(21) Appl. No.: 12/082,387

(22) Filed: Apr. 10, 2008

(65) Prior Publication Data

US 2009/0258615 A1  Oct. 15, 2009

(51) Int. Cl.
*H04B 1/04* (2006.01)

(52) U.S. Cl.
USPC .... 455/114.2; 455/91; 455/114.3; 455/127.2; 375/296; 375/297; 330/149; 330/124 R

(58) Field of Classification Search
USPC ............... 455/114.2, 114.3, 115.1, 118, 125, 455/126, 501, 63.1, 67.11, 67.13, 67.15, 455/68, 71, 91, 127.2; 375/232, 297, 296; 370/293; 327/170; 330/124 R, 149
See application file for complete search history.

(56) References Cited

U.S. PATENT DOCUMENTS

| | | | | | |
|---|---|---|---|---|---|
| 3,714,596 | A | * | 1/1973 | Singh | 329/315 |
| 4,068,186 | A | * | 1/1978 | Sato et al. | 330/149 |
| 4,214,129 | A | * | 7/1980 | Kimbrough | 370/496 |
| 4,242,542 | A | * | 12/1980 | Kimbrough | 370/293 |
| 4,253,180 | A | * | 2/1981 | Kimbrough | 331/8 |
| 5,311,155 | A | * | 5/1994 | Blodgett | 333/28 R |
| 5,793,253 | A | * | 8/1998 | Kumar et al. | 330/124 R |
| 6,141,378 | A | | 10/2000 | de Lantremange | |
| 6,424,216 | B2 | * | 7/2002 | Mu et al. | 330/207 P |
| 6,441,682 | B1 | | 8/2002 | Vinn et al. | |
| 6,539,066 | B1 | | 3/2003 | Heinen | |
| 6,694,131 | B1 | | 2/2004 | Lakkis | |
| 6,885,709 | B1 | * | 4/2005 | Dartois | 375/297 |
| 7,002,403 | B2 | | 2/2006 | Marholev | |
| 7,106,806 | B1 | * | 9/2006 | Kenington | 375/297 |
| 7,132,885 | B2 | | 11/2006 | Capofreddi et al. | |
| 7,146,138 | B2 | * | 12/2006 | Anvari | 455/114.3 |
| 7,791,390 | B2 | * | 9/2010 | Kuroki | 327/231 |
| 7,904,033 | B1 | * | 3/2011 | Wright et al. | 455/114.2 |
| 2008/0285766 | A1 | * | 11/2008 | Arnold | 381/61 |
| 2009/0168864 | A1 | * | 7/2009 | Teramoto | 375/232 |
| 2009/0264089 | A1 | * | 10/2009 | Suzuki et al. | 455/114.3 |
| 2009/0289678 | A1 | * | 11/2009 | Pratt et al. | 327/170 |

OTHER PUBLICATIONS

Dawson, J.L. and Lee, T.H., "Automatic Phase Alignment for a Fully Integrated CMOS Cartesian Feedback Power Amplifier System," *IEEE Journal of Solid-State Circuits*, 10 pages (2003).

(Continued)

*Primary Examiner* — Junpeng Chen
(74) *Attorney, Agent, or Firm* — Sterne, Kessler, Goldstein & Fox, P.L.L.C.

(57) ABSTRACT

A method and apparatus of compensating for an asymmetric frequency response of a radio are disclosed. One method includes estimating a slope control signal, the slope control signal indicating a slope of a frequency response of an amplifier chain of the radio. A difference between gain at positive frequencies and gain at negative frequencies of a complex baseband signal is adjusted with the slope control signal, wherein the complex signal includes an I component and a Q component. The adjusted complex baseband signal is frequency up-converted into a radio signal. The radio signal is amplified by the amplifier chain. The amplified radio signal is transmitted.

20 Claims, 11 Drawing Sheets

OTHER PUBLICATIONS

Hornak, T., "Using polyphase filters as image attenuators," *RF Design*, pp. 26, 28, 30, 32, 34 (Jun. 2001).

Sanderson, D.I. et al., "A 5-6-GHz Polyphase Filter With Tunable I/Q Phase Balance," *IEEE Microwave and Wireless Components Letters*, vol. 14, No. 7, pp. 364-366 (Jul. 2004).

* cited by examiner

COMPENSATION OF AN ASYMMETRIC FREQUENCY RESPONSE OF A RADIO

FIELD OF THE DESCRIBED EMBODIMENTS

The described embodiments relate generally to radio communications. More particularly, the described embodiments relate to a method and apparatus for compensating for an asymmetric frequency response of a radio system.

BACKGROUND

FIG. 1 shows an example a radio that includes an amplifier chain. This exemplary radio includes baseband processing 110, a frequency upconverter 120 (or alternatively, a frequency downconverter), an amplifier chain 130, and an antenna 140. The frequency converter 120 receives a local oscillator that sets the carrier frequency of the amplifier chain 130.

Typically, radio frequency amplifiers utilize resonant stages for impedance matching purposes. Generally, the gain of a resonant stage is maximum at the stage's resonant frequency, and decreases at lower and at higher frequencies. FIG. 2 shows an example of a frequency response of an amplifier chain of a radio. In general, the radio signal band is not located exactly at the resonant frequency, where the frequency response is relatively flat, but rather at some frequency offset away from the resonant frequency, where the frequency response is relatively sloped. A possible location for the signal band 220 is shown in FIG. 2. As a result of the sloped frequency response, some frequency components of the signal obtain more amplification than others. Although the effect is ordinarily small for a single resonant stage, the combined effect of multiple resonant stages can be significant.

One solution to this problem is to adjust the resonant frequency of one or more of the resonant stages in the amplifier. This is unattractive, however, because (1) the technologies used for radio frequency amplifiers are in some cases not amenable to large scale integration, and (2) the parasitic capacitance associated with the tuning circuitry decreases the efficiency of the amplifier. In a direct conversion radio system, there is of course no possibility of performing any compensation for the asymmetric response at an intermediate frequency.

It is desirable to have an apparatus and method for compensating for the asymmetric response of a radio frequency amplifier.

SUMMARY

An embodiment includes a method of compensating for an asymmetric frequency response of a radio. The method includes estimating a slope control signal, the slope control signal indicating a slope of a frequency response of an amplifier chain of the radio. A difference between gain at positive frequencies and gain at negative frequencies of a complex baseband signal is adjusted with the slope control signal, wherein the complex signal includes an I component and a Q component. The adjusted complex baseband signal is frequency up-converted into a radio signal. The radio signal is amplified by the amplifier chain. The amplified radio signal is transmitted.

Another embodiment includes a frequency response compensated radio. The radio includes a means for estimating a slope control signal, wherein the slope control signal indicates a slope of a frequency response of an amplifier chain of the radio. A slope adjustable polyphase filter controllably adjusts a difference between gain at positive frequencies and gain at negative frequencies of a base band complex signal of the radio, wherein the adjustable control is provided by the slope control signal. A frequency translator up-converts the adjusted complex base band signal into a radio signal, and the amplifier chain amplifies the radio signal.

Another embodiment includes another method of compensating for an asymmetric frequency response of a Cartesian feedback radio. The method includes estimating a slope control signal, wherein the slope control signal indicates a slope of a frequency response of an amplifier chain of the radio. A difference between gain at positive frequencies and gain at negative frequencies of a complex baseband signal is adjusted with the slope control signal, wherein the complex baseband signal includes an I component and a Q component. The adjusted complex baseband signal is frequency up-converted into a radio signal. The amplifier chain amplifies the radio signal, which is then transmitted.

Other aspects and advantages of the described embodiments will become apparent from the following detailed description, taken in conjunction with the accompanying drawings, illustrating by way of example the principles of the described embodiments.

DETAILED DESCRIPTION

The described embodiments provide apparatuses and methods for compensating for an asymmetric response of a radio frequency amplifier of a radio. One embodiment includes filtering the baseband signal with an adjustable polyphase filter.

Figure 1:
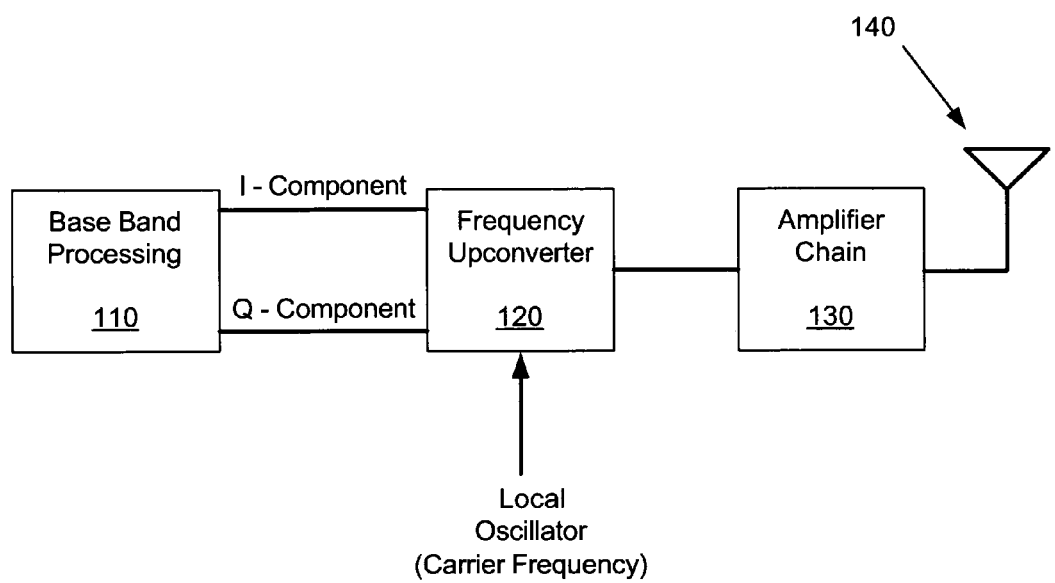
FIG. 1 shows an example of an amplifier chain of a radio.
Figure 2:
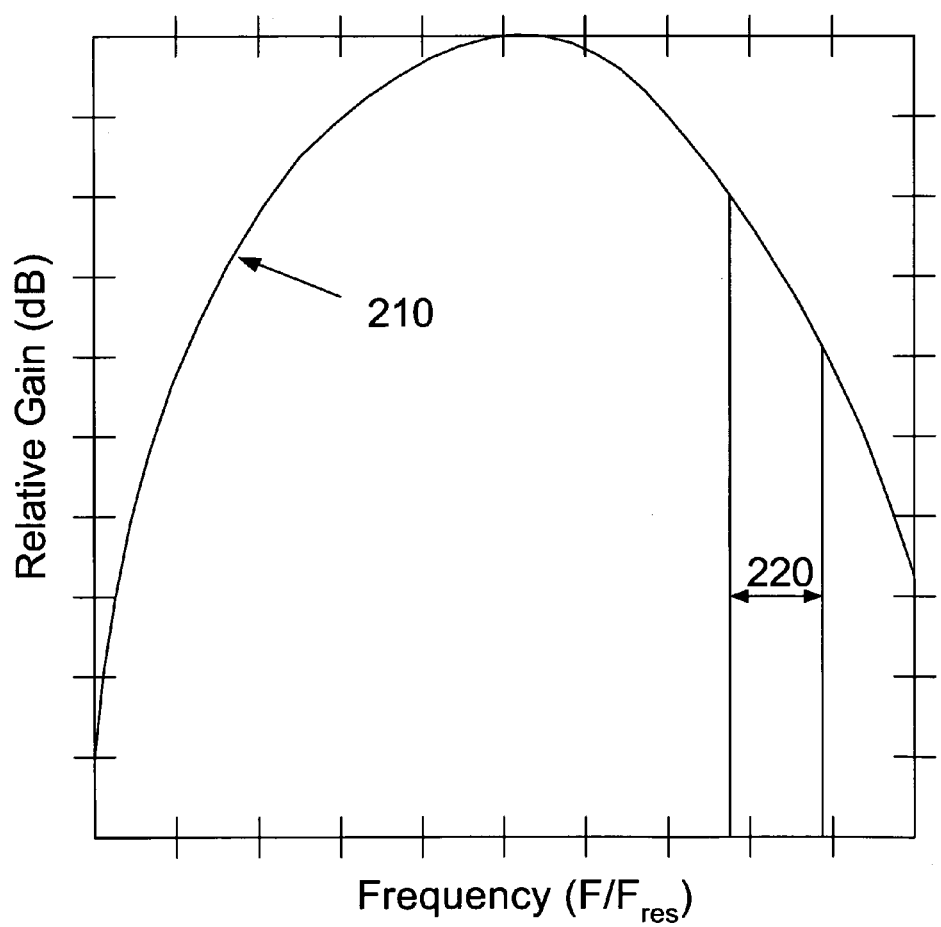
FIG. 2 shows an example of a frequency response of an amplifier chain of a radio.
Figure 3:
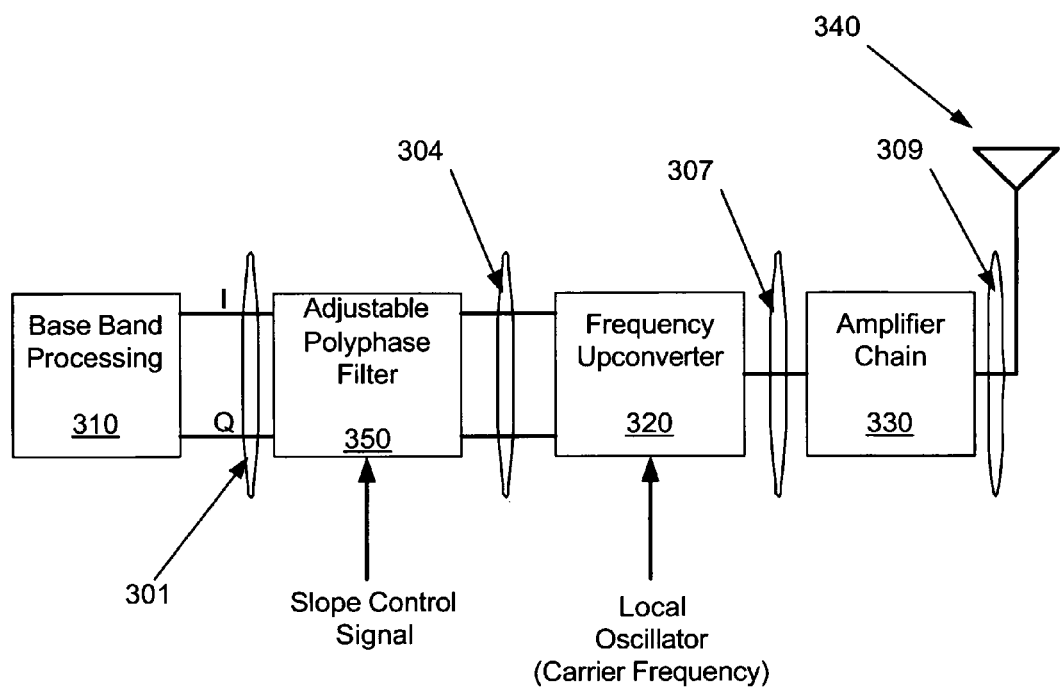
FIG. 3 shows an example of frequency response compensated radio.

FIG. 3 shows an example of frequency response compensated radio. This embodiment includes baseband processing circuitry 310 that generates a complex (I and Q components) baseband signal. The complex baseband signal is coupled to an adjustable polyphase filter 350. The adjustable polyphase filter 350 filters the complex baseband signal with a deliberately sloped frequency response to generate a precompensated complex baseband signal. The slope of the polyphase filter is adjusted by a slope control signal. The precompensated complex baseband signal is coupled to a frequency upconverter 320 that converts the precompensated complex baseband signal to a radio signal centered at a carrier frequency. The carrier frequency is set by the local oscillator. The radio signal is coupled to a radio frequency amplifier (amplifier chain) 330 to produce an amplified radio signal. The amplified radio signal is then transmitted using antenna 340.

Exemplary spectra of signals 301, 304, 307 and 309 are shown in FIGS. 4A, 4B, 4C, 4D. Note that a complex signal I+jQ in general has a spectrum that is not conjugate symmetric and therefore can have different magnitude for positive and negative frequency. The spectrum of the baseband input signal 301 is assumed to be approximately flat in the example. The spectrum of the precompensated complex baseband signal 304 slopes upward in this example and has more energy at positive frequencies due to the intentional asymmetry in the frequency response of the adjustable polyphase filter 350. The spectrum of radio signal 307 has the same shape, but it has been shifted up to the carrier frequency, 1900 MHz in this example. In this example, the radio frequency amplifier 330 provides more amplification to lower frequencies than to higher frequencies. The slope of the frequency response of the radio frequency amplifier 330 is opposite to that of the adjustable polyphase filter 350. As a result, that the spectrum of the amplified radio signal 309 faithfully reproduces the spectral shape of the baseband input signal 301. The direction of the slope of the frequency response of the radio frequency amplifier is selected to be negative for this example, but can in general be positive, negative, or zero.

The slope of the frequency response of the radio frequency amplifier 330 depends on numerous factors, including the carrier frequency, temperature, and manufacturing variations in the components of the radio frequency amplifier 330. In order for the sloped frequency response provided by the adjustable polyphase filter 350 to match and cancel the slope of the frequency response of the radio frequency amplifier 330, an adjustment mechanism must be provided to adjust the slope control signal. The adjustment mechanism may rely upon one or more variables, and the variables may be combined by linear superposition or other arithmetic operation. The variables may include the carrier frequency and the temperature. The adjustment mechanism may also include one or more programmable constants that are individually configured for each manufactured unit to represent manufacturing variations.

Figure 4A:
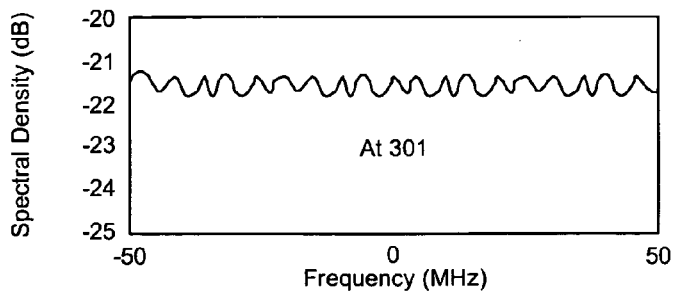
FIGS. 4A, 4B, 4C, 4D show examples of frequency responses at various stages of, for example, the frequency response compensated radio of FIG. 3.
Figure 4B:
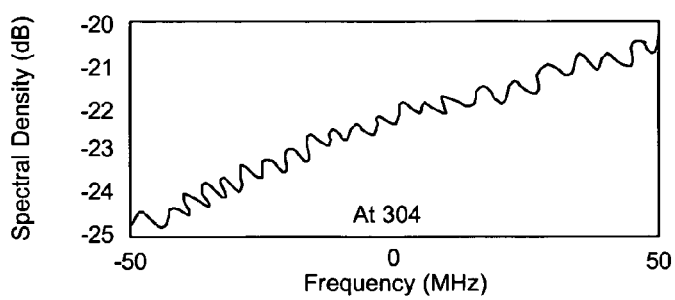
Figure 4C:
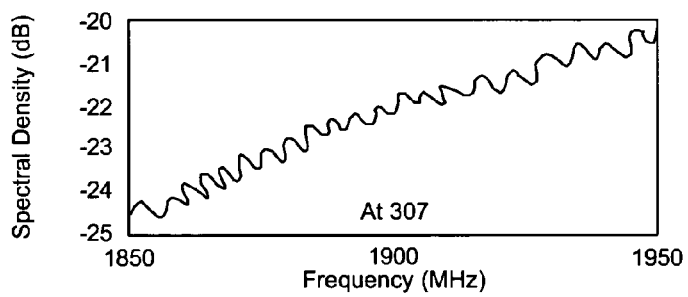
Figure 4D:
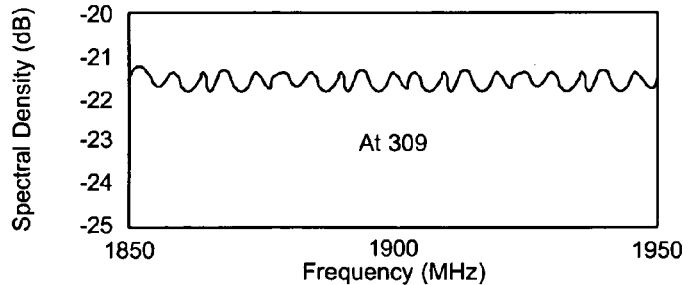

FIGS. 4A, 4B, 4C, 4D show examples of frequency responses at various stages of, for example, the frequency response compensated radio of FIG. 3. FIG. 4A shows the spectral density being relatively flat before the adjustable polyphase filter 350. FIG. 4B shows the pre-compensated spectral density after being gain adjusted by the adjustable polyphase filter 350. FIG. 4C shows the frequency being centered, for example, at 1900 MHz after being frequency translated. FIG. 4D shows the spectral density being relatively flat after passing through the amplifier chain 330.

Figure 5:
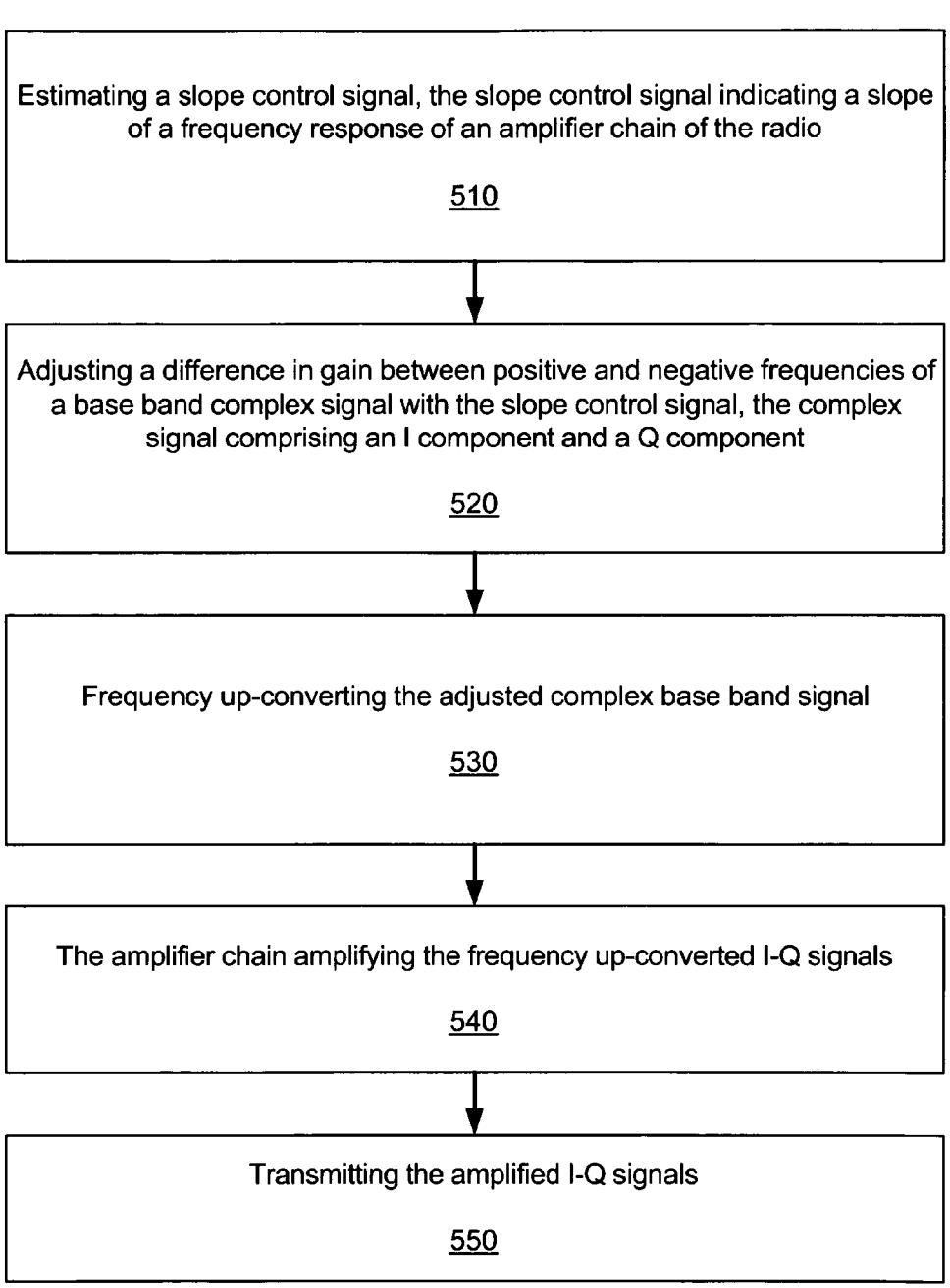
FIG. 5 is a flow chart that includes steps of one example of a method of compensating for an asymmetric frequency response of a radio.

FIG. 5 is a flow chart that includes steps of one example of a method of compensating for an asymmetric frequency response of a radio. A first step 510 includes estimating a slope control signal, wherein the slope control signal indicates a slope of a frequency response of an amplifier chain of the radio. A second step 520 includes adjusting a difference between gain at positive frequencies and gain at negative frequencies of a complex baseband signal with the slope control signal, wherein the complex baseband signal includes an I component and a Q component. A third step 530 includes frequency up-converting the adjusted complex baseband signal into a radio signal. A fourth step 540 includes the amplifier chain amplifying the radio signal. A fifth step 550 includes transmitting the amplified radio signal.

For an embodiment, adjusting the difference between gain at positive frequencies and gain at negative frequencies of the complex base band signal includes a slope adjustable polyphase filter filtering the complex base band signal, wherein the slope control signal controls one of more parameters of the slope adjustable polyphase filter. One specific embodiment includes the slope control signal adjusting a location of at least one zero of the slope adjustable polyphase filter. One other specific embodiment includes the slope control signal adjusting an angular displacement of at least one zero of the slope adjustable polyphase filter.

One embodiment of the adjustable polyphase filtering includes variable transconductance cells coupling I and Q components of the gain adjustable polyphase filter, and adjusting a transconductance of each of the transconductance cells with the slope control signal. One specific embodiment includes a first variable transconductance cell coupling the I component to the Q component having an opposite polarity of a second variable transconductance cell coupling the Q component to the I component. One even more specific embodiment includes a transconductance of at least one of the transconductance cells being negatively responsive to the slope control signal, and the transconductance of the at least one of the transconductance cells being positively responsive to the slope control signal.

More generally, for one embodiment, adjusting the difference between gain at positive frequencies and gain at negative frequencies of the complex baseband signal includes filtering at least one of the I component and the Q component, and at least one of coupling the I component to the Q component and coupling the Q component to the I component.

Generally, the slope of the frequency response of the amplifier chain is dependent upon the carrier frequency of the radio signal. Therefore, an embodiment includes the slope control signal being responsive to changes in a carrier frequency of the radio signal. One specific embodiment includes retrieving the slope control signal from a look up table based on the carrier frequency. That is, the slope of the frequency response can be pre-characterized over possible carrier frequencies. Once characterized, the slope control signal needed to provide proper pre-compensation of the slope for the possible carrier frequencies can be estimated. The estimated slope control signals can be stored in a look up table for future reference and determination of the slope control signal based on the carrier frequency of the radio.

Another embodiment includes the slope control signal being responsive to changes in temperature. That is, the slope of the amplifier chain can change with frequency. These changes can be characterized, and compensated for with the slope control signal.

Figure 6:
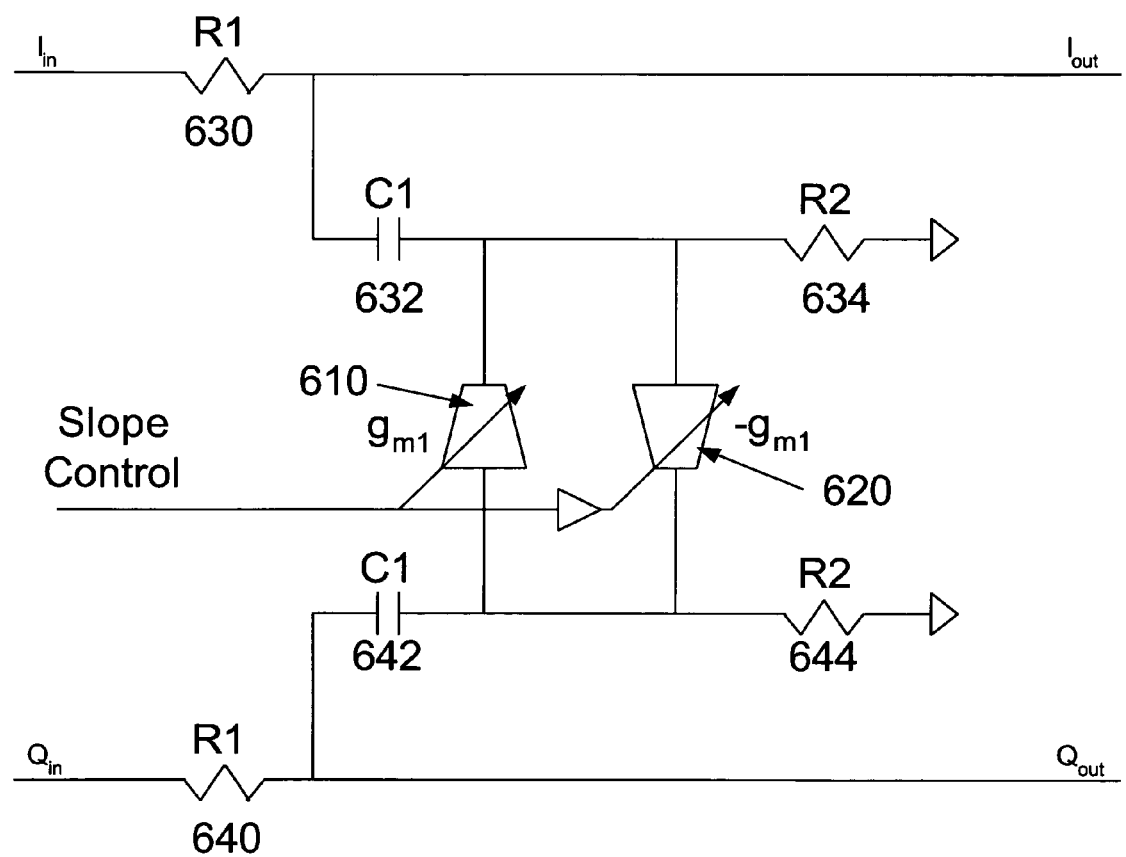
FIG. 6 shows an example of an embodiment of one stage of a single-ended adjustable polyphase filter.

FIG. 6 shows an example of an embodiment of one stage of a single-ended adjustable polyphase filter. Resistors 630 and 640, and capacitors 632 and 642 form two independent low-pass filters for the I and Q channels with a pole at frequency $f_p = -1/2\pi R_1 C_1$. The addition of resistors 634 and 644 results in a zero at frequency $f_z = -1/2\pi R_2 C_1$.

When the two filter phases I and Q are considered as a single complex number I+jQ, where j represents the imaginary unit, the addition of transconductors 610 and 620 moves the zero to a complex frequency of $$f_z = \left(-\frac{1}{R_2} + jG_m\right)\frac{1}{2\pi C_1}.$$

By adjusting the transconductance $G_m$ responsive to the slope control signal, it is possible to vary the zero location, and thus vary the slope of the frequency response of the filter.

In an embodiment, the sign of the transconductor is also adjustable so that more gain can be given to positive frequencies by making $G_m$ positive when required and more gain can be given to negative frequencies by making $G_m$ negative when required. This embodiment includes the transconductors 610 and 620 being connected with opposing polarity.

Although only a single filter stage is shown in FIG. 6, an actual transmitter embodiment might include a baseband filter than includes one or more filter stages preceding this stage, and/or one or more filter stages following this stage. None, some, or all of these additional filter stages might include cross-coupled adjustable transconductors like those shown in FIG. 6.

Figure 7:
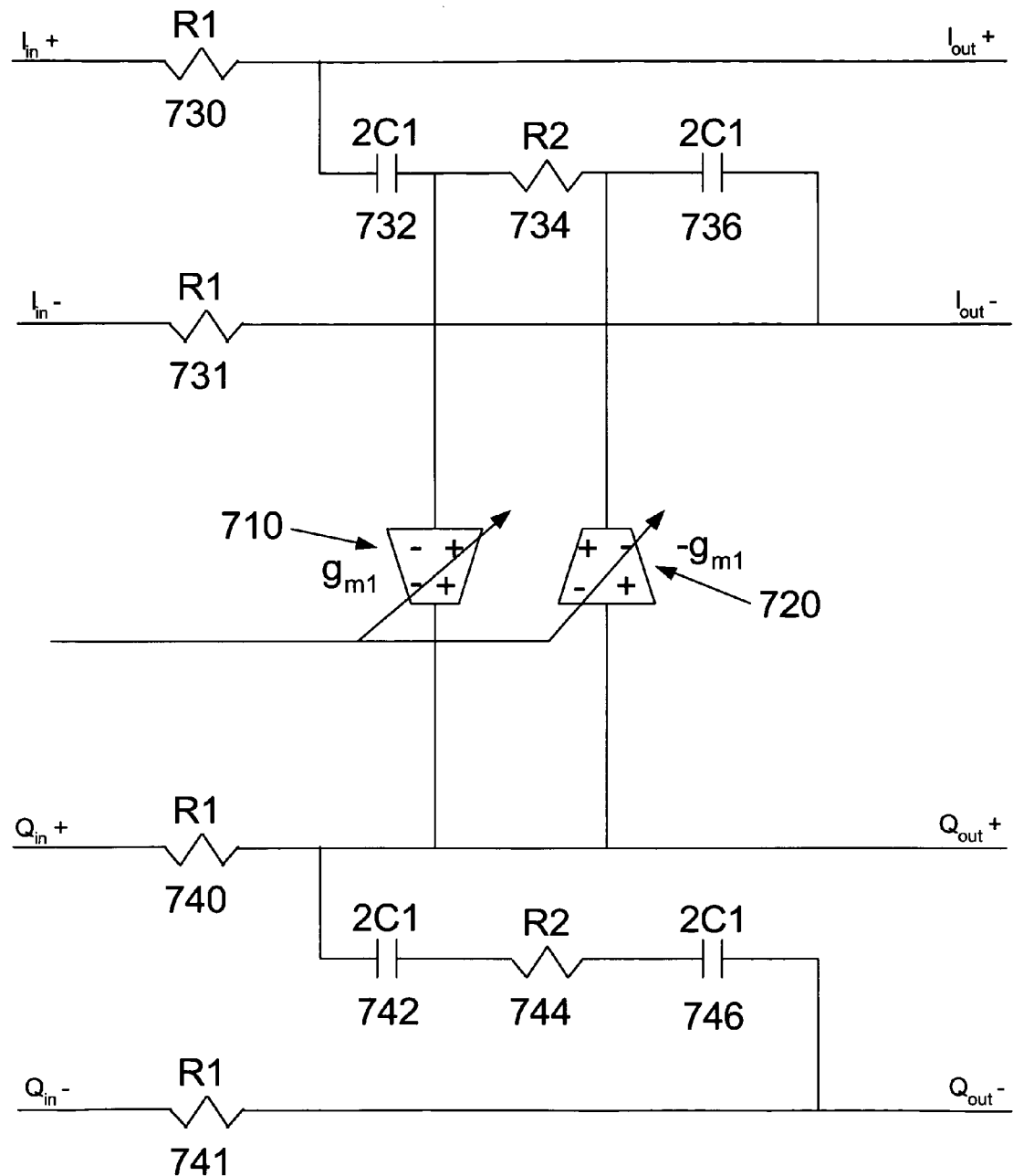
FIG. 7 shows an example of an embodiment of one stage of a differential adjustable polyphase filter.

FIG. 7 shows an example of an embodiment of one stage of a differential adjustable polyphase filter. For improved supply rejection, and for other reasons, it is usually desirable to implement baseband filters using differential signals rather than single-ended signals.

In the topology shown in FIG. 7, the bottom plate parasitics of capacitors 732, 736, 742, 746 contribute to the formation of a parasitic pole as described later.

Resistors 730, 731, 740 and 741, and capacitors 732, 736, 742 and 746 form two independent lowpass filters for the I and Q channels. The addition of resistors 734 and 744, results in a zero in the frequency response. This embodiment includes the transconductors 710 and 720 being connected with opposing polarity.

Figure 8:
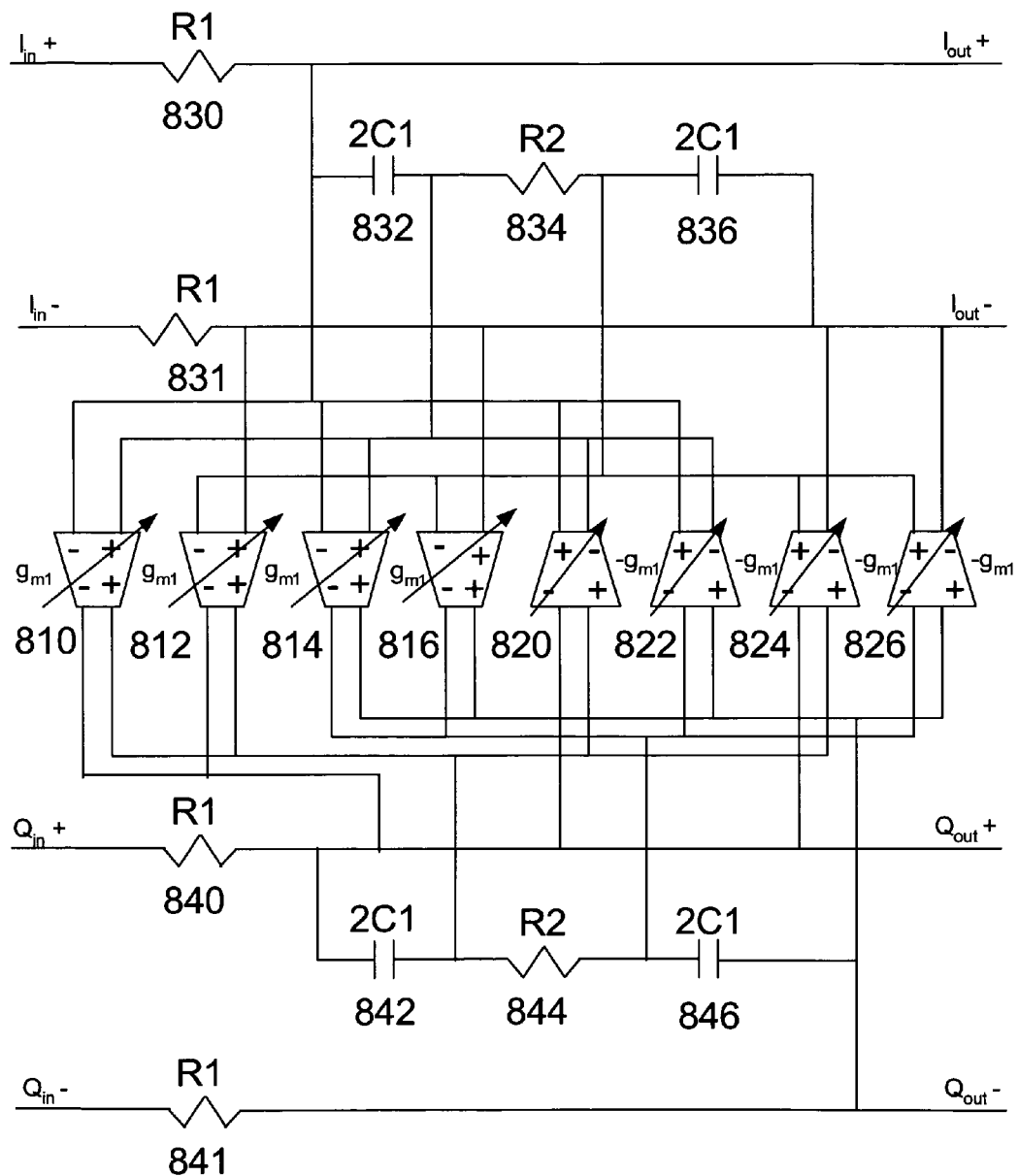
FIG. 8 shows an example of another embodiment of one stage of a differential adjustable polyphase filter.

FIG. 8 shows an example of another embodiment of one stage of a differential adjustable polyphase filter. In this alternative embodiment, the relative positions of series connected resistors 734, 744 and capacitors 732, 736, 742, 746 are swapped. The disadvantage of the alternative topology of this embodiment relative to the embodiment of FIG. 6 is that more adjustable transconductors (810-826) are required, resulting in larger area and increased power consumption.

Figure 9:
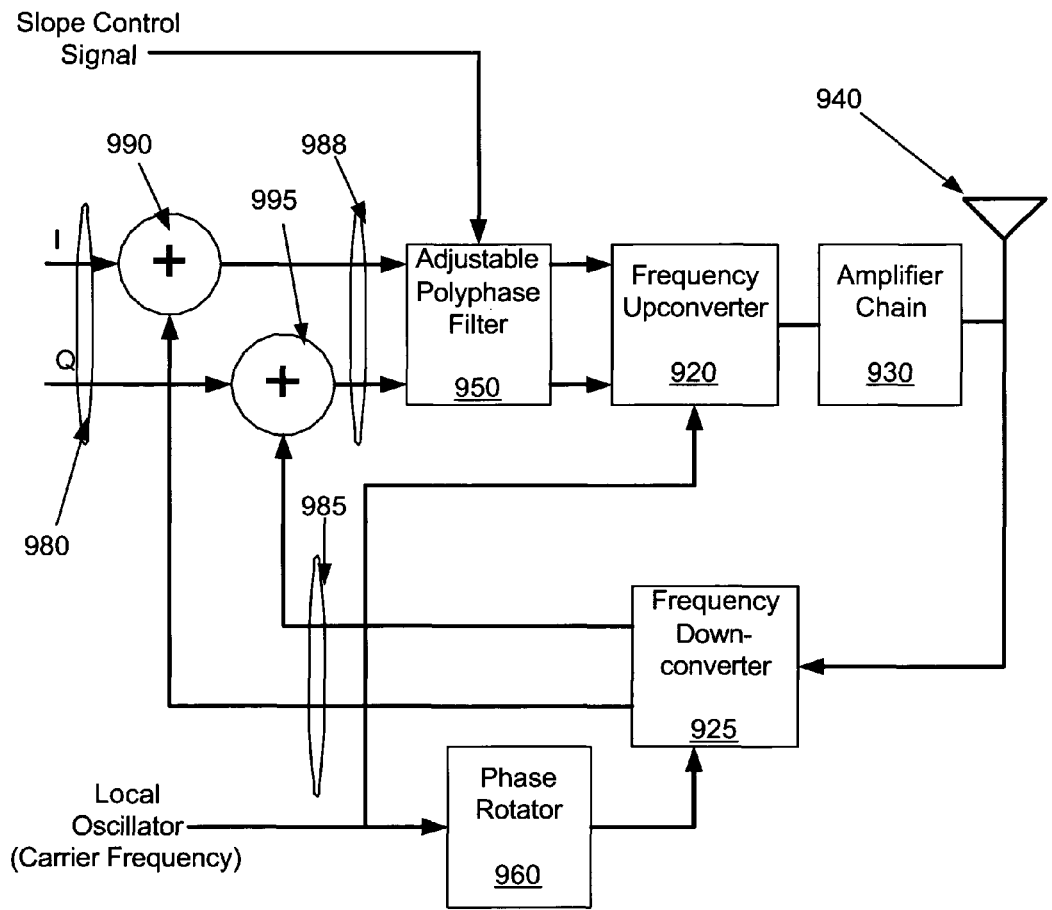
FIG. 9 shows an example of an embodiment of a Cartesian feedback loop transmitter that includes an adjustable polyphase filter.

FIG. 9 shows an example of an embodiment of a Cartesian feedback loop transmitter that includes an adjustable polyphase filter. In a Cartesian feedback loop transmitter, the bandwidth of the feedback loop is typically five to ten times higher than the signal bandwidth. For example in a WiMAX transmitter with a signal bandwidth of 10 MHz, the bandwidth of the Cartesian feedback loop must be approximately 60 MHz. One consequence of the wide bandwidth of the loop is increased sensitivity to any asymmetry in the frequency response of the RF amplifier stages. The difference in gain at the upper and lower ends of the Cartesian feedback loop bandwidth directly subtracts from the gain margin of the system.

For the embodiment of FIG. 9, summers 990, 995 determine the difference between a complex input signal (I and Q) 980 and a complex fed back signal 985. The difference signal 988 is coupled to an adjustable polyphase filter 950. The output of the adjustable polyphase filter 950 is upconverted to radio frequency using upconverter 920. The radio frequency signal is amplified by radio frequency amplifier 930. A small fraction of the output power is coupled into a downconverter circuit 925 to generate the feedback signal 985. The local oscillator drives the frequency upconverter 920, and a phase shifted local oscillator drives the frequency downconverter 925.

Figure 10:
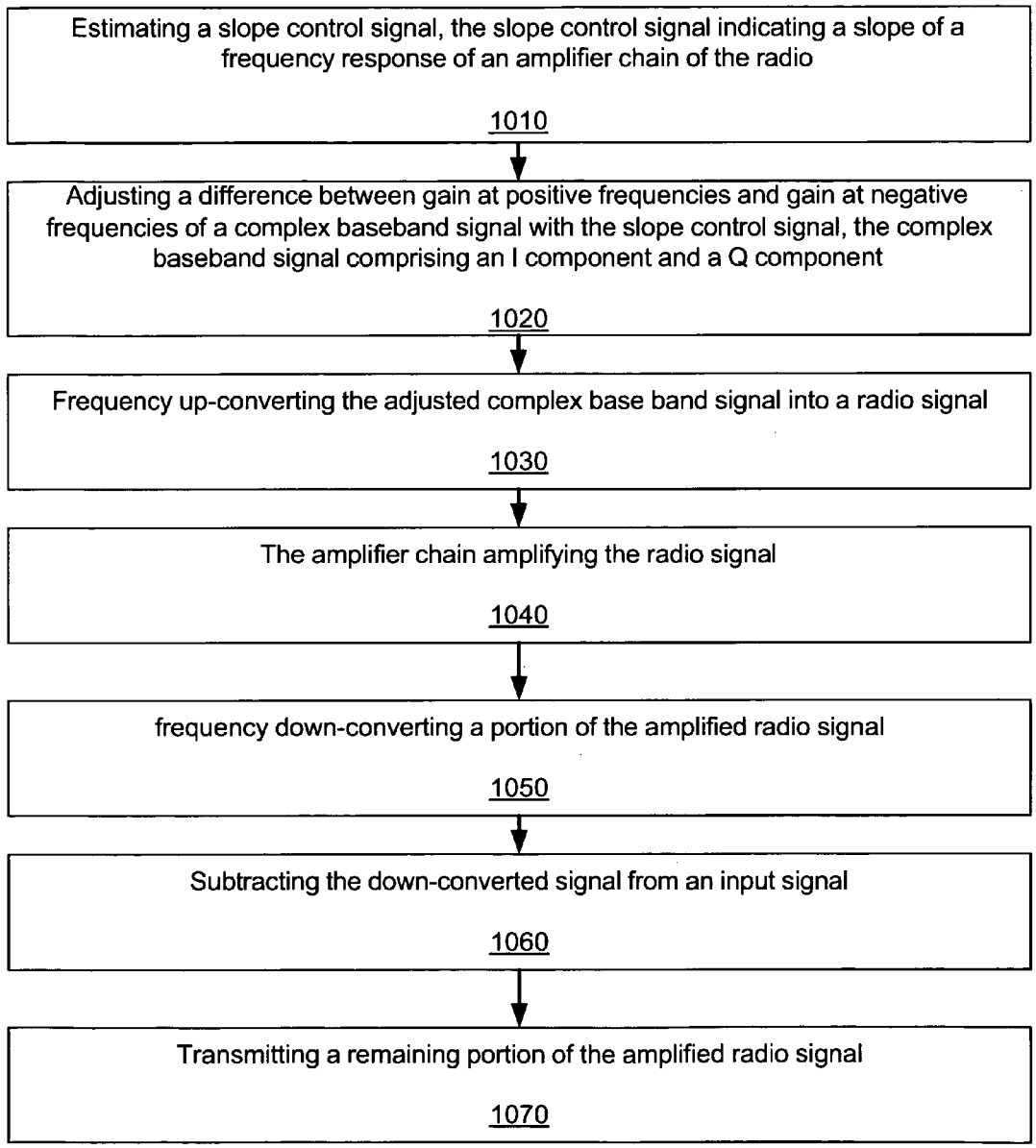
FIG. 10 is a flow chart that includes steps of an example of a method of compensating for an asymmetric frequency response of a Cartesian feedback radio.

FIG. 10 is a flow chart that includes steps of an example of a method of compensating for an asymmetric frequency response of a Cartesian feedback radio. A first step 1010 includes estimating a slope control signal, the slope control signal indicating a slope of a frequency response of an amplifier chain of the radio. A second step 1020 includes adjusting a difference between gain at positive frequencies and gain at negative frequencies of a complex baseband signal with the slope control signal, the complex baseband signal comprising an I component and a Q component. A third step 1030 includes frequency up-converting the adjusted complex baseband signal into a radio signal. A fourth step 1040 includes the amplifier chain amplifying the radio signal. A fifth step 1050 includes frequency down-converting a portion of the amplified radio signal. A sixth step 1060 includes subtracting the down-converted signal from an input signal. A seventh step 1070 includes transmitting a remaining portion of the amplified radio signal.

For an embodiment, adjusting the difference between gain at positive frequencies and gain at negative frequencies of the complex base band signal includes a slope adjustable polyphase filter filtering the complex base band signal, wherein the slope control signal controls one of more parameters of the slope adjustable polyphase filter. One specific embodiment includes the slope control signal adjusting a location of at least one zero of the slope adjustable polyphase filter. One other specific embodiment includes the slope control signal adjusting an angular displacement of at least one zero of the slope adjustable polyphase filter.

One embodiment of the adjustable polyphase filtering includes variable transconductance cells coupling I and Q components of the gain adjustable polyphase filter, and adjusting a transconductance of each of the transconductance cells with the slope control signal. One specific embodiment includes a first variable transconductance cell coupling the I component to the Q component having an opposite polarity of a second variable transconductance cell coupling the Q component to the I component. One even more specific embodiment includes a transconductance of at least one of the transconductance cells being negatively responsive to the slope control signal, and the transconductance of at least one of the transconductance cells being positively responsive to the slope control signal.

More generally, for one embodiment, adjusting the difference between gain at positive frequencies and gain at negative frequencies of the complex baseband signal includes filtering at least one of the I component and the Q component, and at least one of coupling the I component to the Q component and coupling the Q component to the I component.

Generally, the slope of the frequency response of the amplifier chain is dependent upon the carrier frequency of the radio signal. Therefore, an embodiment includes the slope control signal being responsive to changes in a carrier frequency of the radio signal. One specific embodiment includes retrieving the slope control signal from a look up table based on the carrier frequency. That is, the slope of the frequency response can be pre-characterized over possible carrier frequencies. Once characterized, the slope control signal needed to provide proper pre-compensation of the slope for the possible carrier frequencies can be estimated. The estimated slope control signals can be stored in a look up table for future reference and determination of the slope control signal based on the carrier frequency of the radio.

Another embodiment includes the slope control signal being responsive to changes in temperature. That is, the slope of the amplifier chain can change with frequency. These changes can be characterized, and compensated for with the slope control signal.

Embodiments of the adjustable polyphase filter that include transconductor cells are generally sensitive to load capacitance applied to the output. The load capacitance produces a parasitic pole, and this pole moves away from the real axis as the transconductance is adjusted, in the same way that the zero does. The effect of the pole tends to oppose that of the zero, however. At high offset frequency the effect of the pole dominates, making the slope of the frequency response at high frequencies opposite in sign from the desired slope. This effect can be minimized by keeping the load capacitance as small as possible.

Figure 11A:
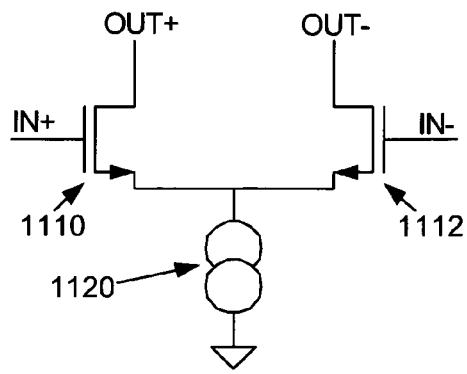
FIGS. 11A, 11B, and 11C show examples of transconductor subcells that can be included within embodiments of adjustable polyphase filters.
Figure 11B:
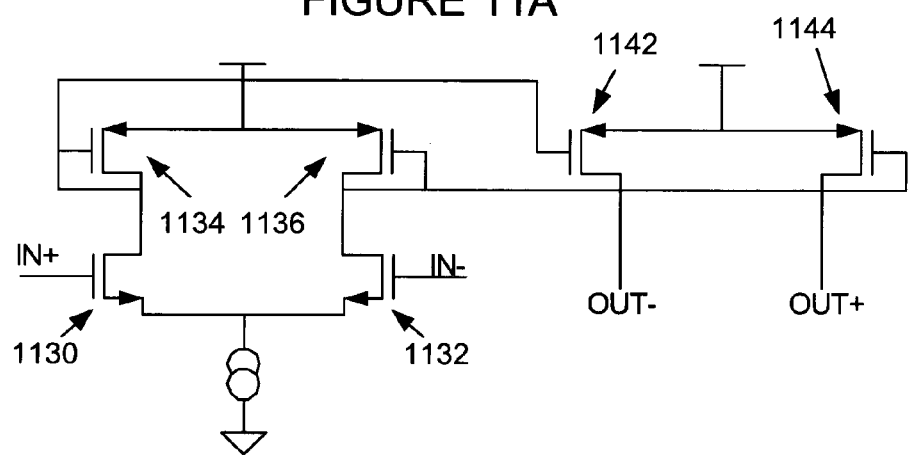
Figure 11C:
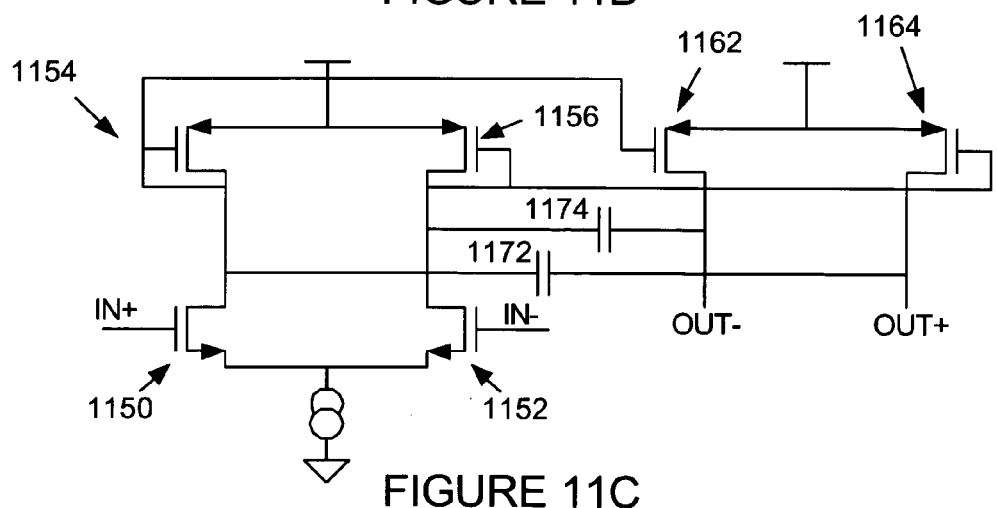

A variable transconductor cell can be implemented using multiple transconductor subcells that are connected, for example, in parallel. FIGS. 11A, 11B, 11C show examples of transconductor subcells that can be included within embodiments of adjustable polyphase filters. The transconductance of the variable transconductor cell can be varied by turning off a subset of the multiple transconductor subcells.

It is desirable that the transconductor cells have low delays. The transconductor cell of FIG. 11A includes a single stage. The single stage includes transistors 1110, 1112 and current source 1120. The transconductor cell of FIG. 11B includes multiple stages, and provides greater signal swing. A first stage includes transistors 1130, 1132, and a second stage includes a current mirror that includes transistors 1134, 1136, 1142, 1144. The transconductor cell of FIG. 11C includes a first stage of transistors 1150, 1152, a second stage including a current mirror formed by transistors 1154, 1156, 1162, 1164, and additionally includes capacitors 1172, 1174 that provide a signal path at high frequencies.

Although specific embodiments have been described and illustrated, the described embodiments are not to be limited to the specific forms or arrangements of parts so described and illustrated. The invention is limited only by the appended claims.

What is claimed:

1. A method of compensating for an asymmetric frequency response of a radio, comprising:
    estimating a slope control signal, the slope control signal indicating a slope of a frequency response of an amplifier chain of the radio;
    adjusting a complex baseband signal with the slope control signal to produce an adjusted complex baseband signal, wherein the adjusting comprises adjusting a difference between gain at positive frequencies and gain at negative frequencies, the complex baseband signal comprising an I component and a Q component;
    frequency up-converting the adjusted complex baseband signal into a radio signal;
    amplifying the radio signal to produce an amplified radio signal; and
    transmitting the amplified radio signal,
    wherein estimating the slope control signal comprises retrieving, based on a carrier frequency of the radio signal, the slope control signal from a look up table, wherein the look up table receives as an input the carrier frequency of the radio signal and produces as an output the slope control signal, and wherein the look up table pre-characterizes the slope control signal over a plurality of carrier frequencies.

2. The method of claim 1, wherein adjusting the difference between gain at positive frequencies and gain at negative frequencies of the complex baseband signal comprises a slope adjustable polyphase filter filtering the complex baseband signal, wherein the slope control signal controls one or more parameters of the slope adjustable polyphase filter.

3. The method of claim 1, wherein adjusting the difference between gain at positive frequencies and gain at negative frequencies of the complex baseband signal comprises filtering at least one of the I component and the Q component, and at least one of coupling the I component to the Q component and coupling the Q component to the I component.

4. The method of claim 1, wherein the slope control signal is further responsive to changes in temperature.

5. The method of claim 2, wherein adjusting the difference between gain at positive frequencies and gain at negative frequencies of the complex baseband signal with the slope control signal comprises adjusting a location of at least one zero of the slope adjustable polyphase filter.

6. The method of claim 2, wherein adjusting the difference between gain at positive frequencies and gain at negative frequencies of the complex baseband signal with the slope control signal comprises adjusting an angular displacement of at least one zero of the slope adjustable polyphase filter.

7. The method of claim 2, further comprising:
    coupling I and Q components of the slope adjustable polyphase filter using variable transconductance cells;
    adjusting a transconductance of each of the variable transconductance cells with the slope control signal.

8. The method of claim 7, wherein a first variable transconductance cell coupling the I component to the Q component has an opposite polarity of a second variable transconductance cell coupling the Q component to the I component.

9. The method of claim 8, wherein a transconductance of at least one of the variable transconductance cells is negatively responsive to the slope control signal, and the transconductance of at least one of the variable transconductance cells is positively responsive to the slope control signal.

10. A frequency response compensated radio comprising:
    a slope adjustable polyphase filter for controllably adjusting a complex baseband signal of the radio, wherein the adjustable control is provided by a slope control signal, the slope control signal indicating a slope of a frequency response of an amplifier chain of the radio;
    a look up table for retrieving the slope control signal based on a carrier frequency of the radio signal, wherein the look up table receives as an input the carrier frequency of the radio signal and produces as an output the slope control signal, and wherein the look up table pre-characterizes the slope control signal over a plurality of carrier frequencies;
    a frequency translator for frequency up-converting the adjusted complex base band signal into a radio signal; and
    the amplifier chain for amplifying the radio signal.

11. The radio of claim 10, further comprising:
    variable transconductance cells for coupling I and Q components of the slope adjustable polyphase filter;
    means for adjusting a transconductance of each of the transconductance cells with the slope control signal.

12. The radio of claim 11, wherein a first variable transconductance cell coupling the I component to the Q component has an opposite polarity of a second variable transconductance cell coupling the Q component to the I component.

13. The radio of claim 12, wherein a transconductance of at least one of the variable transconductance cells is negatively responsive to the slope control signal, and the transconductance of at least one of the variable transconductance cells is positively responsive to the slope control signal.

14. The radio of claim 10, wherein the slope adjustable polyphase filter comprises:
means for adjusting a difference between gain at positive frequencies and gain at negative frequencies of the complex baseband signal with the slope control signal,
wherein said means for adjusting the difference between gain at positive frequencies and gain at negative frequencies of the complex baseband signal with the slope control signal comprises means for adjusting a location of at least one zero of the slope adjustable polyphase filter.

15. The radio of claim 10, wherein the slope adjustable polyphase filter comprises:
means for adjusting a difference between gain at positive frequencies and gain at negative frequencies of the complex baseband signal with the slope control signal,
wherein said means for adjusting the difference between gain at positive frequencies and gain at negative frequencies of the complex baseband signal with the slope control signal comprises means for adjusting an angular displacement of at least one zero of the slope adjustable polyphase filter.

16. A method of compensating for an asymmetric frequency response of a Cartesian feedback radio, comprising:
estimating a slope control signal, the slope control signal indicating a slope of a frequency response of an amplifier chain of the radio;
adjusting a complex baseband signal with the slope control signal to produce an adjusted complex baseband signal, wherein the adjusting comprises adjusting a difference between gain at positive frequencies and gain at negative frequencies, the complex baseband signal comprising an I component and a Q component;
frequency up-converting the adjusted complex baseband signal into a radio signal;
amplifying the radio signal to produce an amplified radio signal;
frequency down-converting a portion of the amplified radio signal to produce a down-converted signal;
subtracting the down-converted signal from an input signal; and
transmitting a remaining portion of the amplified radio signal,
wherein estimating the slope control signal comprises retrieving, based on a carrier frequency of the radio signal, the slope control signal from a look up table, wherein the look up table receives as an input the carrier frequency of the radio signal and produces as an output the slope control signal, and wherein the look up table pre-characterizes the slope control signal over a plurality of carrier frequencies.

17. The method of claim 16, wherein adjusting the difference between gain at positive frequencies and gain at negative frequencies of the complex baseband signal comprises a slope adjustable polyphase filter filtering the complex baseband signal, wherein the slope control signal controls one or more parameters of the slope adjustable polyphase filter.

18. The method of claim 16, wherein adjusting the difference between gain at positive frequencies and gain at negative frequencies of the complex baseband signal comprises filtering at least one of the I component and the Q component, and at least one of coupling the I component to the Q component and coupling the Q component to the I component.

19. The method of claim 16, wherein the slope control signal is responsive to changes in temperature.

20. The method of claim 17, wherein adjusting the difference between gain at positive frequencies and gain at negative frequencies of the complex baseband signal with the slope control signal comprises adjusting a location of at least one zero of the slope adjustable polyphase filter.

* * * * *